United States Patent [19]

Madden et al.

[11] Patent Number: 5,155,382

[45] Date of Patent: Oct. 13, 1992

[54] TWO-STAGE CMOS LATCH WITH SINGLE-WIRE CLOCK

[75] Inventors: William C. Madden, Lexington; Vidya Rajagopalan, Hudson, both of Mass.

[73] Assignee: Digital Equipment Corporation, Maynard, Mass.

[21] Appl. No.: 832,742

[22] Filed: Feb. 7, 1992

[51] Int. Cl.⁵ .................. H03K 3/289; H03K 19/017
[52] U.S. Cl. .................. 307/272.2; 307/448; 307/451; 307/291; 307/279; 307/571; 307/572; 307/576; 307/480; 307/481
[58] Field of Search ............ 302/448, 451, 291, 272.2, 302/279, 571-572, 576, 480-481

[56] References Cited

U.S. PATENT DOCUMENTS 4,804,867 2/1989 Okitaka et al. .................. 302/279

FOREIGN PATENT DOCUMENTS 0198917 10/1985 Japan.
0172430 8/1987 Japan.

Primary Examiner—Stanley D. Miller
Assistant Examiner—Margaret R. Wambach
Attorney, Agent, or Firm—Arnold, White & Durkee

[57] ABSTRACT

A master/slave latch circuit employs a single-wire clock, with the clock being applied to only N-channel transistors in the master latch and to only P-channel transistors in the slave latch so that a race-through condition is alleviated in the event of clock skew. The circuits are of ratioless operation, since P-channel transistors are used in each circuit to pull the high side to the supply voltage, and N-channel transistors are used on the low side to assure a zero voltage level. Input to each latch is to the gates of a P-channel pull-up and an N-channel pull-down, while the storage node is between the two clocked transistors. The level of the storage node is inverted and fed back to at transistor across one of the clocked transistors, the one on the high side for the master latch and the low side for the slave latch, and these feedback transistors are of a channel type to support the ratioless scheme.

14 Claims, 1 Drawing Sheet 5,155,382

TWO-STAGE CMOS LATCH WITH SINGLE-WIRE CLOCK

BACKGROUND OF THE INVENTION

This invention relates to latch circuits in semiconductor integrated circuit devices, and more particularly to a latch circuit for use with a single-wire clock.

In semiconductor integrated circuit devices, such as microprocessors or memory circuits, various clocks must be made available at many points on the chip. Delays and intercoupling cause the clocks to become skewed, especially when multiple-phase clocks are employed.

It has previously been the practice in CMOS latches to use true and complement clocks to clock the PMOS and NMOS devices in each latch. The function of complementing (inverting) the clock voltage causes an inherent skew, and so the conventional CMOS latches are prone to the "race-through" problem.

A method of alleviating the race-through problem is to feed the single-wire clock to one type of device only, in each latch-the clock going to N-channel transistors in the master latch and P-channel transistors in the slave latch. Generally, it is preferable to have the clock and data inputs feeding the gates of MOS transistors, thus providing an high impedance input. Also, it is preferable to have the outputs of the latches to be non-dynamic nodes.

Another drawback to prior implementations of CMOS latches is that NMOS devices alone do not pass good "1" levels, and PMOS devices alone do not pass good zero levels. To help restore the level to a full rail, feedback can be employed, but this will in general lead to DC rationing between the clocked device and the feedback device. Alternatively, multistage latches can be employed which do not have DC ratioing; however, such latches normally incur an undue number of gate delays from input to output, and are complex, requiring a large number of transistor devices to accomplish the function.

SUMMARY OF THE INVENTION

In accordance with one embodiment of the invention, a master/slave latch circuit employs a single-wire clock, with the clock being applied to only N-channel transistors in the master latch and to only P-channel transistors in the slave latch so that a race-through condition is reduced by minimizing clock skew. The circuits are of ratioless operation, since P-channel transistors are used in each circuit to pull the high side to supply voltage, and N-channel transistors are used on the low side to assure a zero voltage level. Input to each latch is to the gates of a P-channel pull-up and an N-channel pull-down, while the storage node is between the two clocked transistors. The level of the storage node is inverted and fed back to a transistor across one of the clocked transistors, the one on the high side for the master latch and the low side for the slave latch, and these feedback transistors are of a channel type to support the ratioless scheme.

BRIEF DESCRIPTION OF THE DRAWINGS

The novel features believed characteristic of the invention are set forth in the appended claims. The invention itself, however, as well as other features and advantages thereof, will be best understood by reference to the detailed description of a specific embodiment, when read in conjunction with the accompanying drawings, wherein:

DETAILED DESCRIPTION OF SPECIFIC EMBODIMENT

Figure 1:
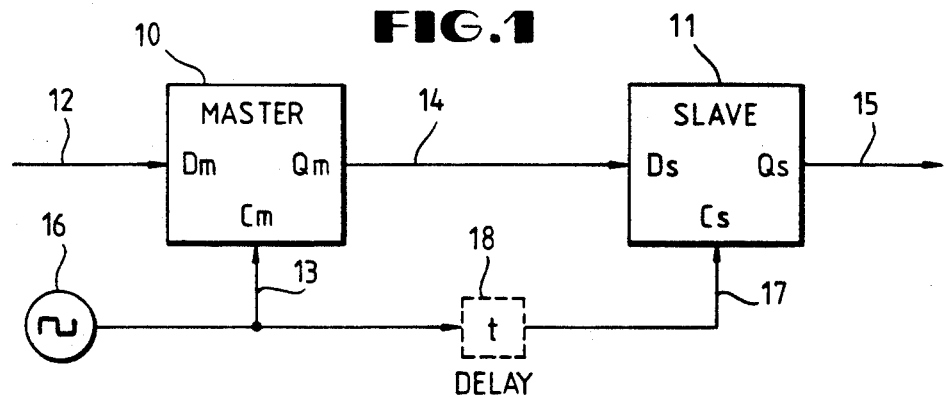
FIG. 1 is an electrical diagram in block form of a master/slave latch circuit which may employ features of the invention.
Figure 2:
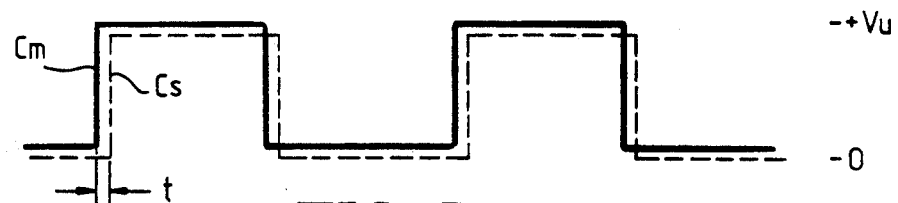
FIG. 2 is a timing diagram showing a clock voltage used in the circuit of FIG. 1.

Referring to FIG. 1, a circuit is shown having a master flip-flop or latch 10 and a slave flip-flop or latch 11, both of which are simple transparent latches of the DQ type. The master latch 10 receives a data input $D_m$ on line 12 and a clock input $C_m$ on line 13, and produces an output $Q_m$ on line 14. The slave latch 11 receives an input $D_s$ which is the $Q_m$ output from the master on line 14, and receives a clock $C_s$, to produce a $Q_s$ output on line 15. The clocking arrangement is of the "single-wire" type in that a clock source 16 produces the clock $C_m$ on line 13 to the master latch and also results in the clock $C_s$ on line 17 to the slave latch. Ideally, the clock inputs 13 and 17 are identical in phase, but a clock skew may be introduced by the distribution of the clock about the chip, as represented by a delay t caused by block 18. The clock waveforms $C_m$ and $C_s$ are seen in FIG. 2, where these clocks are skewed by an amount t rather than being identical in phase.

In operation, data in the circuit of FIG. 1 passes from input $D_m$ to output $Q_m$ when the clock input $C_m$ is high, and passes from input $D_s$ to output $Q_s$ when the clock input $C_s$ is low. That is, each of the latches 10 and 11 is a transparent latch. In the case of a skew delay, introduced by the transfer circuit 18, a possibility exists for race-through when $C_m$ goes high while $C_s$ is still low; in this situation the value at $D_m$ is propagated through the output $Q_m$, the input $D_s$, to the output $Q_s$ during the time t before the clock $C_s$ has gone high. This corrupts the data because the slave latch is not supposed to switch until the clock $C_s$ goes low in the next half cycle.

Figure 3:
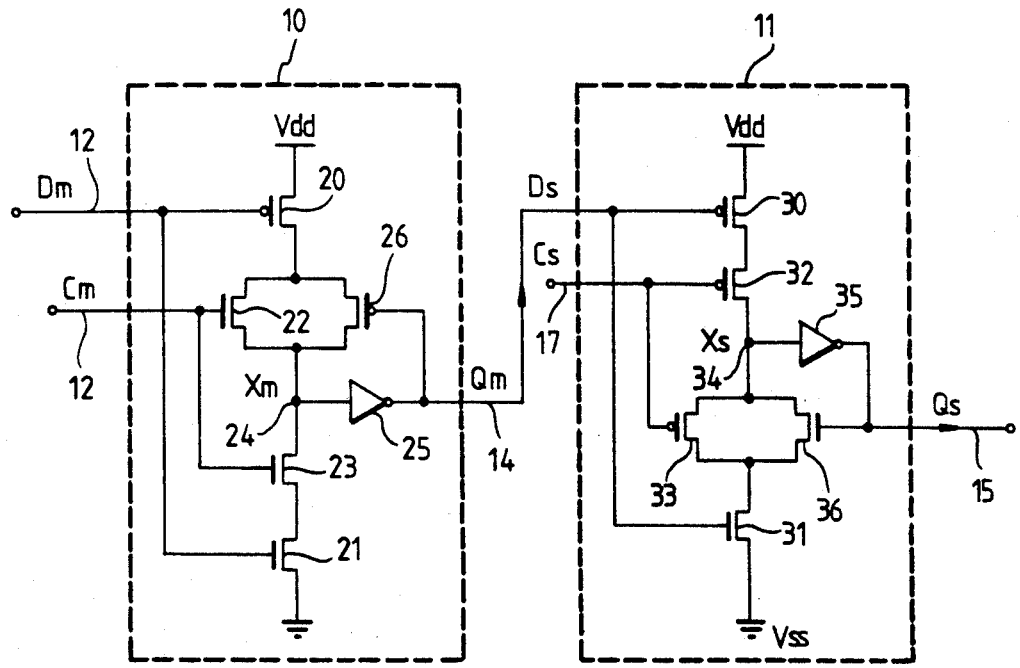
FIG. 3 is an electrical diagram in schematic form of the master/slave latch circuit of FIG. 1 according to one embodiment of the invention.

Referring to FIG. 3, according to one embodiment of the invention, the pair of master/slave latch circuits 10 and 11 are constructed using CMOS technology such that the clock is fed to one device type only in each latch, NMOS devices in the master latch 10 and PMOS devices in the slave latch. The master latch 10 includes a pair of P- and N-channel transistors 20 and 21 receiving the data input $D_m$ on their gates, with the clock input $C_m$ applied to the gates of a pair of N-channel transistors 22 and 23 in series with the source-to-drain paths of the input transistors 20 and 21. Thus, when clock $C_m$ is high, $X_m$, an intermediate node 24, will be the inverse of the input $D_m$, and when the clock $C_m$ goes low this output node 24 is held at the value existing at the time of the transition. The output $Q_m$ of the latch is the inverted value on the node 24, through the inverter 25. Feedback to the clock transistor 22 is provided by a P-channel transistor 26 having the output $Q_m$ on its gate, so when node 24 is pulled high by P-channel transistor 20 (input $D_m$ is low), the transistor 26 is turned on (as soon as the switching point of the inverter 25 is reached), and the node 24 is pulled all the way to Vdd. If the input $D_m$ now changes to a "1" value (high), the transistor 20 turns off, and the N-channel transistors 21 and 23 pull the node 24 to Vss, with no DC ratioing. When $C_m$ transitions back to a "0" (low) the data ("1" or "0") is stored on node 24 until the next $C_m$ clock cycle.

The slave latch 11 includes a pair of P- and N-channel transistors 30 and 31 receiving the data input $D_s$ on their gates, with the clock input $C_s$ applied to the gates of a pair of P-channel transistors 32 and 33 in series with the source-to-drain paths of the input transistors 30 and 31. When clock $C_s$ is low the transistors 32 and 33 are turned on, and $X_s$, an intermediate node 34, will be the inverse of the input $D_s$. When the clock $C_s$ is at zero level and input $D_s$ is at a one level, transistors 31 and 33 pull $X_s$ low. When the node $X_s$ reaches the switching point of the inverter 35, $Q_s$ goes high and feedback through the transistor 36 pulls the node $X_s$ all the way to zero. If the input $D_s$ now changes to a "0" value (low), the transistor 30 turns on, and the transistors 30 and 32 pull the node 34 to Vdd, with no DC ratioing. When $C_s$ transitions back to a "1" (high) the data then existing is stored on node 34 until the next clock cycle.

The problem of race-through is reduced in the circuit of FIG. 3 due to the fact that the clock is not inverted. Rather, a single wire clock is applied to only N-channel transistors 22 and 23 in the master latch 10 and to only P-channel transistors 32 and 33 in the slave latch 11. High impedance input is provide to both latch circuits since only MOS transistor gates are driven at the input transistors 20, 21 or 30, 31. The outputs are buffered by the inverters 25 and 35 so the storage nodes 24 and 34 are not loaded. From input to output of each latch there are only two gate delays (input transistors 21, 20, or 31, 30, and inverter 25 or 35). No DC ratioing is present because of the P-channel transistor 20 which decouples the P-channel transistor 26 on low-going transitions in the master latch, and the N-channel transistor 31 which decouples the N-channel transistors 36 on high-going transitions in the slave latch. The number of transistors in each latch circuit is seven (counting two transistors in the inverter 25 or 35), so the device count is relatively low compared to other circuits of this general function. FIG. 2 demonstrates the reduced delay inherent in a single wire clock.

While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments which fall within the true scope of the invention.

What is claimed is:

1. A CMOS logic circuit comprising:
   a) a first latch circuit having a first, second, third and fourth transistors, each having a source-to-drain path and a gate, said source-to-drain paths of said transistors being connected in series in the order named between terminals of a voltage supply; a juncture between said second and third transistors being connected through an inverter to an output for said first latch circuit; said output for said first latch circuit being connected to a gate of a fifth transistor having a source-to-drain path connected across said second transistor; said first and fourth transistors being of opposite channel conductivity type; said gates of said first and fourth transistors being connected to a logic input;
   b) a second latch circuit having first, second, third and fourth transistors, each having a source-to-drain path and a gate, said source-to-drain paths of said transistors being connected in series in the order named between terminals of a voltage supply; a juncture between said second and third transistors being connected through an inverter to an output for said second latch circuit; said output for said second latch circuit being connected to a gate of a fifth transistor having a source-to-drain path connected across said third transistor; said first and fourth transistors of the second latch circuit being of opposite channel conductivity type; said gates of said first and fourth transistors of said second latch circuit being connected to said output of said first latch circuit;
   c) a single clock voltage connected to said gates of said second and third transistors of said first latch circuit and to said gates of said second and third transistors of said second latch circuit; said second and third transistors of said first latch circuit being of opposite channel conductivity type than said second and third transistors of said second latch circuit.

2. A circuit according to claim 1 wherein said second and third transistors of said first latch circuit are N-channel, and said second and third transistors of said second latch circuit are P-channel.

3. A circuit according to claim 2 wherein said fifth transistor of said first latch circuit is P-channel, and said fifth transistor of said second latch circuit is N-channel.

4. A circuit according to claim 3 wherein said first transistors of both said first and second latch circuits are P-channel, and said fourth transistors of both said first and second latch circuits are N-channel.

5. A circuit according to claim 1 wherein said clock voltage has a first state and a second state, said first latch circuit passing data during said first state and latching during said second state, and said second latch circuit passing data during said second state and latching during said first state.

6. A circuit according to claim 5 wherein said first state is a positive voltage and said second state is a zero voltage.

7. A CMOS master/slave latch circuit comprising:
   a) a master latch circuit having a first input P-channel transistor in series with a first clocked N-channel transistor, said first input P-channel transistor and said first clocked N-channel transistor having source-to-drain paths in series between a terminal of a voltage supply and an intermediate node; and having a second input N-channel transistor in series with a second clocked N-channel transistor, said second input N-channel transistor and said second clocked N-channel transistor having source-to-drain paths in series between another terminal of said voltage supply and said intermediate node; said intermediate node being connected through an inverter to an output for said master latch circuit; said output for said master latch circuit being connected to a gate of a third P-channel transistor having a source-to-drain path connected across said first clocked N-channel transistor; said first input P-channel transistor and said second input N-channel transistor having gates connected to a circuit input;
   b) a slave latch circuit having a first input P-channel transistor in series with a first clocked P-channel transistor, said input P-channel transistor and said first clocked P-channel transistor having source-to-drain paths in series between a terminal of a voltage supply and an intermediate node; and having a second input N-channel transistor in series with a second clocked P-channel transistor, said second input N-channel transistor and said second clocked P-channel transistor, having source-to-drain paths in series between another terminal of said voltage supply and said intermediate node; said intermediate node being connected through an inverter to an output for said slave latch circuit; said output for said slave latch circuit being connected to a gate of a third N-channel transistor having a source-to-drain path connected across said second clocked P-channel transistor; said first input P-channel transistor and said second input N-channel transistor having gates coupled to said output for said master latch circuit;

c) a single clock voltage connected to gates of said first and second clocked transistors of said master latch circuit and to gates of said first and second clocked transistors of said slave latch circuit.

8. A circuit according to claim 7 wherein said single clock voltage has a first state and a second state, said master latch circuit passing data during said first state and latching during said second state, and said slave latch circuit passing data during said second state and latching during said first state.

9. A circuit according to claim 7 wherein said first state is a positive voltage and said second state is a zero voltage.

10. A circuit according to claim 7 wherein said voltage supply has a positive and a ground terminal.

11. A method of operating a CMOS master/slave latch circuit, comprising the steps of:

a) applying a data input to gates of first and fourth transistors of a master latch circuit having a first, second, third and fourth transistors, each having a source-to-drain path and a gate, said source-to-drain paths of said transistors being connected in series in the order named between terminals of a voltage supply; said first and fourth transistors being of opposite channel conductivity type;

b) connecting a juncture between said second and third transistors of said master latch circuit through an inverter to an output for said master latch circuit;

c) connecting said output for said master latch circuit to a gate of a fifth transistor having a source-to-drain path connected across said second transistor;; said gates of said first and fourth transistors being connected to a logic input;

d) applying said output for said master latch circuit to gates of first and fourth transistors of a slave latch circuit first, second, third and fourth transistors, each having a source-to-drain path and a gate, said source-to-drain paths of said transistors being connected in series in the order named between terminals of a voltage supply; said first and fourth transistors of the slave latch circuit being of opposite channel conductivity type;

e) connecting a juncture between said second and third transistors of said slave latch circuit through an inverter to an output for said slave latch circuit;

f) connecting said output for said slave latch circuit to a gate of a fifth transistor of said slave latch circuit having a source-to-drain path connected across said third transistor of said slave latch circuit; and g) applying a single clock voltage to said gates of said second and third transistors of said master latch circuit and to said gates of said second and third transistors of said slave latch circuit; said second and third transistors of said master latch circuit being of opposite channel conductivity type than said second and third transistors of said slave latch circuit.

12. A method according to claim 11 wherein said single clock voltage has a first state and a second state, said master latch circuit passing data during said first state and latching during said second state, and said slave latch circuit passing data during said second state and latching during said first state.

13. A method according to claim 12 wherein said first state is a positive voltage and said second state is a zero voltage.

14. A method according to claim 13 wherein said voltage supply has a positive and a ground terminal.

* * * * *

UNITED STATES PATENT AND TRADEMARK OFFICE
CERTIFICATE OF CORRECTION

PATENT NO.   :   5,155,382
DATED        :   October 13, 1992
INVENTOR(S)  :   Madden et al.

It is certified that error appears in the above-identified patent and that said Letters Patent is hereby corrected as shown below:

Column 1, line 35, change "rationing" to --ratioing--.

Column 3, line 27, change "is provide" to --provided--.

Signed and Sealed this

Eighth Day of February, 1994

Attest:

BRUCE LEHMAN

Attesting Officer

Commissioner of Patents and Trademarks